United States Patent [19]
Hurst et al.

[11] Patent Number: 5,956,267
[45] Date of Patent: Sep. 21, 1999

[54] SELF-ALIGNED WORDLINE KEEPER AND METHOD OF MANUFACTURE THEREFOR

[75] Inventors: Allan T. Hurst, Anoka; William Vavra, Maple Plain, both of Minn.

[73] Assignee: Honeywell Inc, Minneapolis, Minn.

[21] Appl. No.: 08/993,009

[22] Filed: Dec. 18, 1997

[51] Int. Cl.$^6$ .......................... G11C 11/00; G11C 11/14; G11C 11/15
[52] U.S. Cl. .......................... 365/158; 365/171; 365/173
[58] Field of Search .................................. 365/158, 171, 365/173

[56] References Cited

U.S. PATENT DOCUMENTS

| | | | |
|---|---|---|---|
| 3,816,909 | 6/1974 | Maeda et al. | 29/604 |
| 3,947,831 | 3/1976 | Kobayashi et al. | 365/57 |
| 4,044,330 | 8/1977 | Johnson et al. | 365/189.02 |
| 4,060,794 | 11/1977 | Feldman et al. | 365/233 |
| 4,158,891 | 6/1979 | Fisher | 365/222 |
| 4,455,626 | 6/1984 | Lutes | 365/158 |
| 4,731,757 | 3/1988 | Daughton et al. | 365/173 |
| 4,780,848 | 10/1988 | Daughton et al. | 365/173 |
| 5,039,655 | 8/1991 | Pisharody | 365/161 |
| 5,064,499 | 11/1991 | Fryer | 438/3 |
| 5,140,549 | 8/1992 | Fryer | 365/171 |
| 5,251,170 | 10/1993 | Daughton et al. | 365/158 |
| 5,361,226 | 11/1994 | Taguchi et al. | 365/171 |
| 5,375,082 | 12/1994 | Katti et al. | 365/158 |
| 5,432,734 | 7/1995 | Kawano et al. | 365/158 |
| 5,496,759 | 3/1996 | Yue et al. | 438/3 |
| 5,547,599 | 8/1996 | Wolfrey et al. | 252/62.54 |
| 5,569,617 | 10/1996 | Yeh et al. | 438/3 |
| 5,659,499 | 8/1997 | Chen et al. | 365/158 |
| 5,768,180 | 6/1998 | Pohm | 365/158 |

OTHER PUBLICATIONS

Pohm et al., "The Architecture of a High Performance Mass Store with GMR Memory Cells", *IEEE Trans. on Mag.*, vol. 31, No. 6., Nov. 1995.

Pohm et al., "Experimental and Analytical Properties of 0.2 Micron Wide, Multi–Layer, GMR, Memory Elements", *IEEE Trans. on Mag.*, vol. 32, No. 5, Sep. 1996.

*Primary Examiner*—Trong Phan
*Attorney, Agent, or Firm*—Gregory A. Bruns

[57] ABSTRACT

A word line structure, and method of manufacture therefor, for a monolithically formed magnetoresistive memory device having a magnetic field sensitive bit region. In a preferred embodiment, the word line structure includes a dielectric layer having an etched cavity formed therein, wherein the cavity has a bottom surface and two spaced side surfaces. A magnetic field keeper is provided adjacent to the back and/or side surfaces of the cavity. A conductive word line is also provided in the cavity and adjacent to the magnetic field keeper to at least substantially fill the cavity. A polishing step may be used to remove any portion of the magnetic field keeper and/or conductive word line that lie above the top surface of the dielectric layer to provide a planer top surface.

28 Claims, 7 Drawing Sheets

SELF-ALIGNED WORDLINE KEEPER AND METHOD OF MANUFACTURE THEREFOR

CROSS REFERENCE TO CO-PENDING APPLICATIONS

The present application is related to U.S. patent application Ser. No. 08/993,005, filed Dec. 18, 1997, entitled "HIGH DENSITY MAGNETIC MEMORY DEVICE AND METHOD OF MANUFACTURE THEREFOR", which is assigned to the assignee of the present invention and incorporated herein by reference.

This invention was made with Government support under Contract Number N00014-96-C-2114 awarded by DARPA AND NRL. The Government has certain rights in the invention.

BACKGROUND OF THE INVENTION

1. Field of the Invention

The present invention generally relates to ferromagnetic thin film memories and sensors and, more particularly, relates to wordline keepers for thin film magnetoresistive memory devices and sensors.

2. Description of the Prior Art

Digital memories of various kinds are used extensively in computer and computer system components, digital processing systems and the like. Such memories can be formed, to considerable advantage, based on the storage of digital bits as alternative states of magnetization of magnetic materials in each memory cell, typically thin-film materials. These films may be thin ferromagnetic films having information stored therein based on the direction of the magnetization occurring in those films. The information is typically obtained either by inductive sensing to determine the magnetization state, or by magnetoresistive sensing of each state.

Such ferromagnetic thin-film memories may be conveniently provided on the surface of a monolithic integrated circuit to thereby provide easy electrical interconnection between the memory cells and the memory operating circuitry on the monolithic integrated circuit. When so provided, it is desirable to reduce the size and increase the pack density of the ferromagnetic thin-film memory cells to achieve a significant density of stored digital bits.

Typically, a thin-film magnetic memory includes a number of bit lines intersected by a number of word lines. At each intersection, a thin film of magnetically coercive material is interposed between the corresponding word line and bit line. The magnetic material at each intersection forms a magnetic memory cells in which a bit of information is stored.

A number of competing factors influence the packing density that can be achieved for such a memory. A first factor is the size of the memory cells. The size of the memory cells must typically decrease with increased packing density. Reducing the size of the memory cell, however, can reduce the magnitude of the magnetic field that can be produced by the word and sense line currents in each memory cell.

A second factor is the width and thickness of the word lines. The dimensions of the word lines must typically decrease with increased packing density. Reducing the dimensions of the word lines, however, reduces the current that can be accommodated thereby, and thus the magnetic field at the corresponding magnetic bit region.

A third factor is the distance between the word lines, and thus the distance between a wordline and an adjacent memory cell. Typically, the distance between word lines must decreases with increased packing density. However, this increases the possibility that the magnetic field produced by one word line may adversely effect the information stored in an adjacent memory cell.

U.S. Pat. No. 5,039,655 to Pisharody discloses one approach for reducing the magnetic field cross-talk between a word line and an adjacent memory cell. Pisharody discloses providing a magnetic field keeper formed from a superconductor material around at least three sides of the word lines. Pisharody states that the superconductor material may shunt the magnetic fields generated by a word line, and thus reduce the effects thereof on an adjacent memory cell.

In Pisharody, a number of bit lines are deposited on an insulating layer, wherein each bit line includes a thin metallic conductor surrounded by a film of magnetically coercive material. An insulating layer is then deposited over the bit lines. A number of parallel word lines oriented generally perpendicular to the bit lines are then provided over the bit lines. The magnetic material at the intersection of the bit lines and the word lines define the memory cells.

A thin insulating layer is deposited over the word lines which separates a thin film of superconducting material from the word lines. Because the thin insulating layer follows the contour of the word lines, the superconducting material covers three sides of each word line. Pisharody states that the superconducting material shunts the magnetic fields generated by the word lines, thereby allowing the word lines to be packed closer to one another in the array structure.

One limitation of Pisharody is that the word lines and corresponding vias are formed after the magnetic film. For minimum size and pitch, metal deposition, and in particular via processing, must typically be performed at temperatures that may damage or otherwise degrade the magnetic properties of the magnetic material. This is particularly true for metal processes the use tungsten or other similar material. Thus, in Pisharody, the word line metal and vias may have to be formed at non-minimum dimensions, or alternatively, formed using non-conventional fabrication techniques which are performed at reduced temperatures. Thus, it would be desirable to provide a word line structure where the word line metal and all vias are provided before the magnetic material of the memory cell, thus allowing the use of conventional fabrication techniques, when desired.

Another limitation of Pisharody is that the dielectric layer between the magnetic film on the bit lines and the word lines must be relatively thick. This is primarily because the dielectric layer is deposited over a relatively non-planer surface, including the bit lines. This reduces the effective magnetic field produced by the word line at the magnetic film. Thus, it would be desirable to provide a word line structure that is relatively planer, thereby allowing a thinner dielectric layer between the word line and the magnetic film.

SUMMARY OF THE INVENTION

The present invention overcomes many of the disadvantages of the prior art by providing a self-aligned word line structure where the word line metal and bit line vias are provided before the magnetic material of the memory cell. Further, the word line structure of the present invention may be formed using conventional integrated circuit fabrication techniques. Finally, the word line structure of the present invention has a relatively planer top surface, thereby allowing a thinner dielectric layer between the word line and the magnetic film of the memory cells.

In a preferred embodiment, the word line structure is formed in a dielectric layer that is provided over the underlayers of a conventional integrated circuit. A cavity is formed in the dielectric, wherein the cavity has a bottom surface and two spaced side surfaces. A soft magnetic material layer, which preferably also includes cladding first and second barrier layer, is provided on the bottom and/or side surfaces of the cavity. Thus, the soft magnetic material layer partially fills the cavity. A conductive material layer is then provided in the cavity and above the soft magnetic material layer to at least substantially fill the cavity. A magnetic bit region can then be provided above the cavity, separated from the conductive material layer by a thin dielectric layer, to form the memory cell.

More specifically, it is contemplated that the cavity may be formed in the dielectric layer using conventional etching techniques. In a preferred embodiment, a photoresist is provided to a top surface of the dielectric layer, wherein selected portions of the photoresist are removed to form a desired pattern. The exposed portions of the dielectric layer are removed using a conventional etching process.

The soft magnetic material layer is preferably provided by depositing the first barrier layer on the dielectric layer, covering at least the bottom and/or two spaced side surfaces of the cavity. A soft magnetic material is then deposited over the first barrier layer. Finally, the second barrier layer is preferably deposited over the soft magnetic material. Ideally, the first and second barrier layers are formed during the same deposition process step as the soft magnetic material.

The conductive material layer is preferably provided by depositing the conductive material on the soft magnetic material layer to at least substantially fill the cavity. In a preferred embodiment, the conductive material layer and the soft magnetic material layer also are provided on the top surface of the dielectric layer including selected portions that are not within the cavity. In this configuration, those portions of the soft magnetic material layer and conductive material layer that are on, or extend above, the top surface of the dielectric layer may be removed using a polishing step. Mechanical or chemical-mechanical polishing are preferred. The polishing step provides a relatively planer top surface thereby allowing a thinner dielectric layer to be deposited between the word line and the magnetic film. This may increase the effective magnetic field produced by the word line at the magnetic film.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

As indicated above, the present invention provides a self-aligned word line structure where the word line metal and bit line vias are provided before the magnetic material of the memory cell. Further, the word line structure of the present invention may be formed using conventional integrated circuit fabrication techniques. Finally, the word line structure of the present invention has a relatively planer top surface, thereby allowing a thinner dielectric layer between the word line and the magnetic film of the memory cells.

Figure 1:
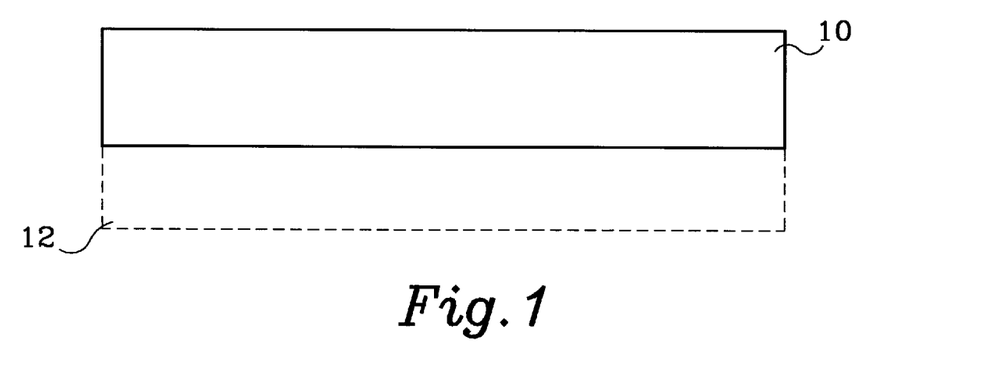
FIG. 1 is a cross section of a dielectric layer, preferably provided on conventional integrated circuit underlayers.

FIG. 1 is a cross section of a dielectric layer 10, preferably provided on conventional integrated circuit underlayers 12. The underlayers 12 may include, for example, all circuit layers for a conventional CMOS wafer up to the metal layers. The underlayers 12 are shown using a dashed line, and are not included in the subsequent figures for clarity.

Dielectric layer 10 preferably includes approximately 8000 angstroms of borophosphosilicate glass (BPSG). Normal front-end IC processing typically deposits approximately 5000 angstroms of BPSG over the poly runners and field areas of the underlayers. Topography in a normal IC process can be more severe than is desired for MRAM (Magnetic RAM) devices. To provide the additional oxide thickness needed to smooth out the remaining underlayer topography, the MRAM process may add an additional approximately 3000 angstroms of BPSG, and reflow it at approximately 800 degrees C., thereby resulting in the approximately 8000 angstroms of BPSG in dielectric layer 10.

Figure 2:
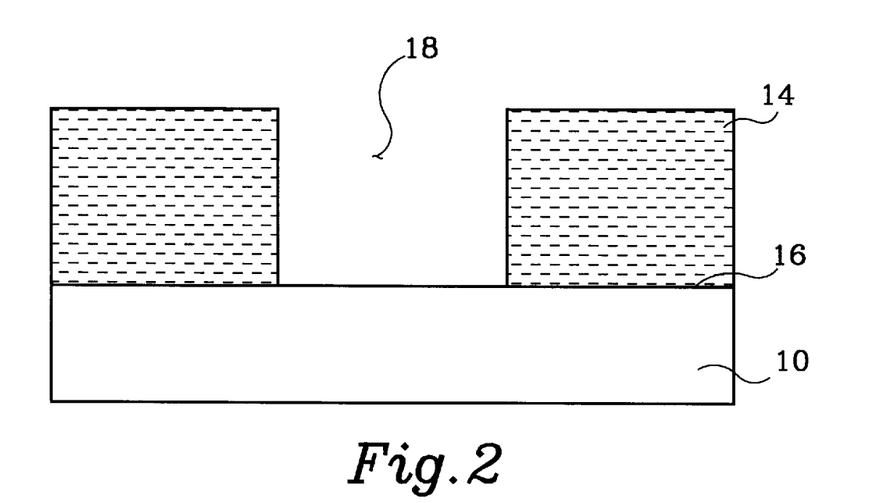
FIG. 2 is a cross section of the dielectric layer of FIG. 1 with a patterned photoresist provided on the top surface thereof.
Figure 3:
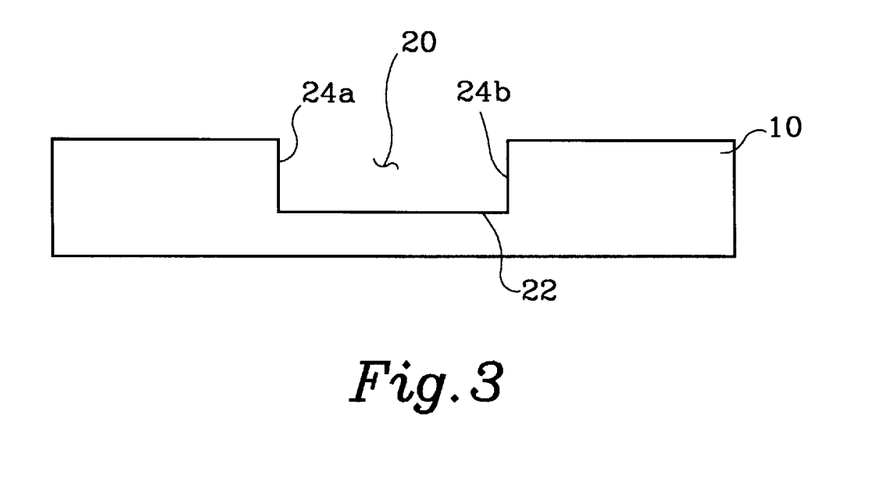
FIG. 3 is a cross section of the dielectric layer of FIG. 2 after a cavity is etched therein, and after the patterned photoresist is removed.

To form a cavity in the dielectric layer 10, a photoresist layer 14 is provided on the top surface 16 of the dielectric layer 10. The photoresist layer 14 is patterned in a conventional manner to selectively remove a portion 18 of the photoresist layer 14 which overlays the desired cavity, as shown in FIG. 2. The exposed portion of the dielectric layer 10 is then etched using a conventional etching process to form cavity 20 as shown in FIG. 3. The cavity 20 has a bottom surface 22 and two spaced side surfaces 24a and 24b. The photoresist is subsequently removed.

Figure 4:
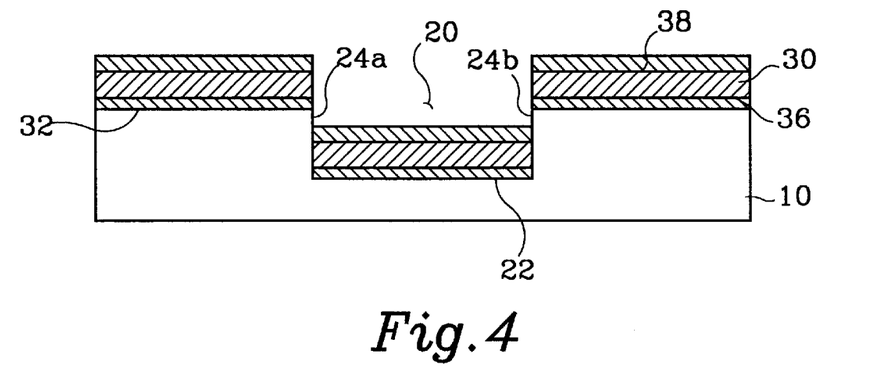
FIG. 4 is a cross section of the dielectric layer and cavity of FIG. 3 with the soft magnetic material layer deposited on the bottom surface of the cavity.

FIG. 4 is a cross section of the dielectric layer 10 and cavity 20 of FIG. 3, with a soft magnetic material layer 30 deposited thereon. In the illustrative embodiment, the deposition of the soft magnetic material layer 30 only occurs on the horizontal surfaces of the dielectric layer 10, including the bottom surface 22 of the cavity 20, and the remaining top surface 32 of the dielectric layer 10. As can be seen,.the soft magnetic material layer 30 preferably only partially fills the cavity 20.

The soft magnetic material layer 30 may include a first barrier layer 36, a second barrier layer 38 and a soft magnetic material 30 therebetween. The first and second barrier layers are preferably made from Ta, TiW, TiN, TaN, SiN, SiO2, or similar material. The soft magnetic material is preferably formed from NiFe, NiFeCo, CoFe, or other similar material having soft magnetic properties. It is contemplated that the first barrier layer 36, the second barrier layer 38 and soft magnetic material 30 may be deposited during a single conventional deposition process step, as is known in the art.

After the soft magnetic material layer 30 is deposited, a conductive material layer 50 is deposited on the top surface of the soft magnetic field layer 30. The conductive material layer 50 is deposited to at least substantially fill the cavity 20, and preferably covers the entire wafer including those portions of the soft magnetic material layer 30 that lie outside of the cavity 20. Conductive material layer 50 is preferably formed form Cu or AlCu. As can be seen, the conductive material layer 50 is self-aligned with the soft magnetic field layer 30.

It is contemplated that a number of contacts or vias may be provided between selected underlayers and/or metal lines before and after the conductive material layer 50 is deposited. In one embodiment, each of the contacts/vias are filled with tungsten to reduce the resulting contact/via resistance. It is known that this may require relatively high processing temperatures. However, and in accordance with the present invention, the contact and via processing may be performed before the magnetic materials are provided, thereby preserving the magnetic properties of the magnetic materials.

Figure 5:
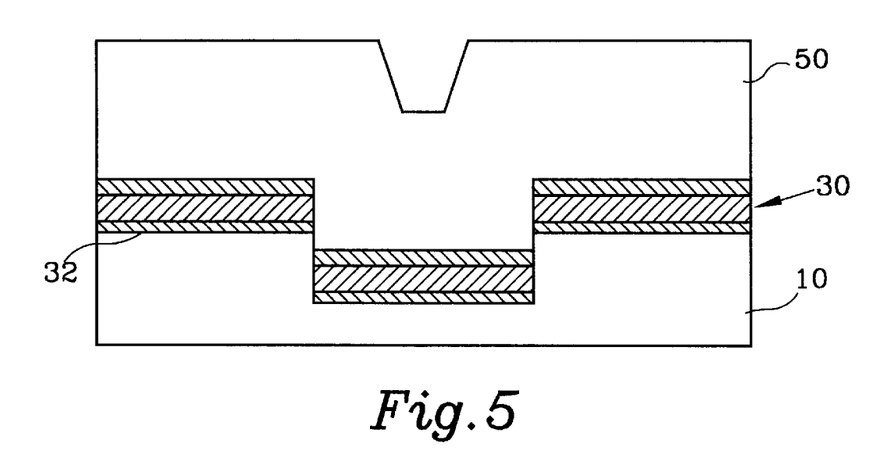
FIG. 5 is a cross section of the dielectric layer and soft magnetic material layer of FIG. 4 with the conductive material layer deposited thereon.
Figure 6:
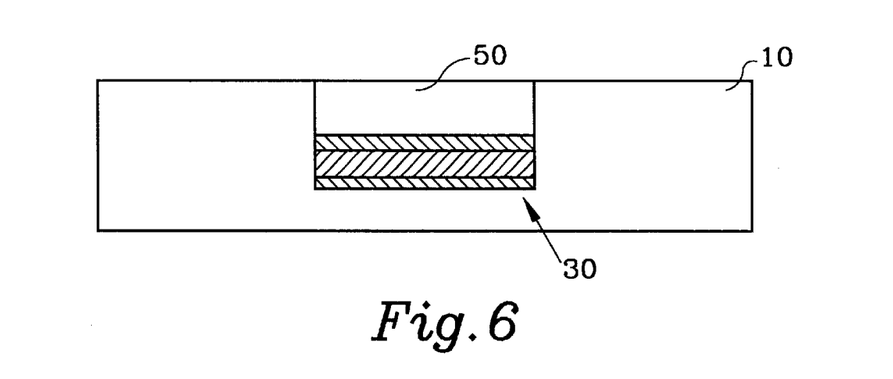
FIG. 6 is a cross section of the dielectric layer, soft magnetic material layer and conductive material layer of FIG. 4 with those portions that are above the top surface of the dielectric layer removed.

As can be seen, portions of the soft magnetic material layer 30 and conductive material layer 50 may lie above the top surface 32 of the dielectric layer 10. In a preferred embodiment, these portions may be removed using a mechanical or chemical-mechanical polishing (CMP) process. FIG. 5 is a cross section showing the dielectric layer 10, the soft magnetic material layer 30, and the conductive material layer 50 after the polishing step is completed.

In performing the polishing step, a commercial semiconductor CMP polishing system is used, which are available from Strasbaugh, IPEC, Speedpham or other supplier. Preferably, a Strasbaugh 6DT system is used in conjunction with a Suba IV polishing pad available from Rodel Corporation. An ammonium hydroxide based slurry is preferably used, having aluminum particles suspended therein. The platten speed is preferably set to 30–60 revolutions per minute, and the down pressure is set to 2–5 PSI.

Figure 7:
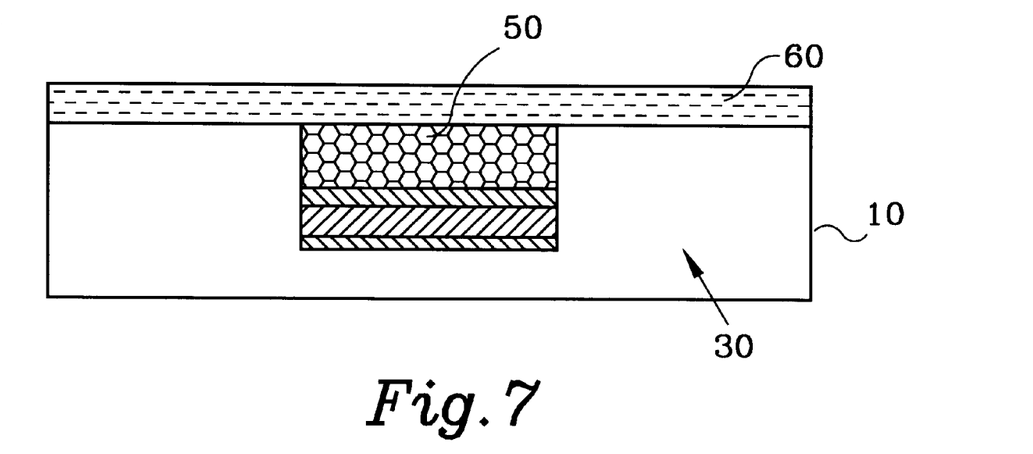
FIG. 7 is a cross section of the dielectric layer, soft magnetic material layer and conductive material layer of FIG. 6 with a thin dielectric layer deposited thereon.

Polishing the top surface of the dielectric layer to remove those portions of the soft magnetic material layer 30 and conductive material layer 50 that lie above the top surface of the dielectric layer 10 provides a number of advantages. First, a relatively planer top surface is provided. This allows the deposition of a relatively thin dielectric layer 60 as shown in FIG. 7, which increases the magnetic field produced by the conductive material layer 50 at bit region 70. Second, the conductive material layer 50 may be made from any type of material since mechanical and chemical-mechanical polishing are typically non-selective. Deposition/photoresist/etch processes typically are limited to the types of metals that can be used.

Figure 8:
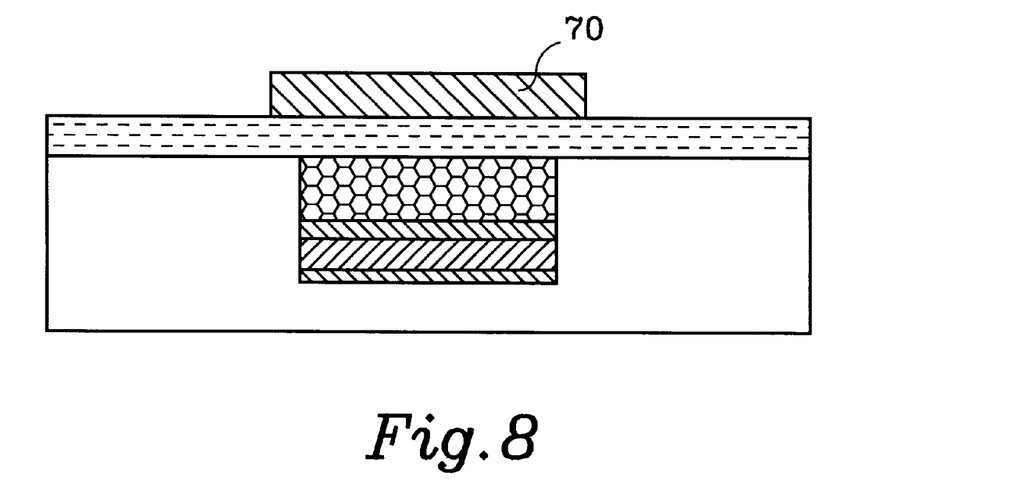
FIG. 8 is a cross section of the dielectric layer, soft magnetic material layer, conductive material layer and thin dielectric layer of FIG. 7 after the magnetic material is deposited and patterned thereon.

After polishing, a thin dielectric layer 60 is provided on the top surface of the dielectric layer 10, and over the cavity 20, as shown in FIG. 7. Finally, a bit region 70 is deposited and patterned on the thin dielectric layer 60 as shown in FIG. 8.

Bit region 70 may be a sandwich-type structure similar to that disclosed in commonly assigned U.S. Pat. No. 5,496, 759 to Yue et al., which is incorporated herein by reference. As further described in Yue et al., bit region 70 may include a silicon nitride diffusion barrier layer of approximately 300 angstroms. A first layer of a 65% Ni, 15% Fe, and 20% Co Permalloy of approximately 150 angstroms is then deposited. Next, a non-magnetic intermediate layer of TaN is deposited to a thickness of approximately 50 angstroms. Then a second layer of a Permalloy is deposited to a thickness of approximately 150 angstroms. This is followed by depositing a second non-magnetic resistive layer of tantalum nitride to a thickness of 50–1000 angstroms, preferably about 550 angstroms. A capping, or etch stop, layer of Chromium silicon (CrSi) is then deposited to a thickness in the range of 100 to 1500 angstroms, preferably about 800 angstroms. All of the depositions of bit region 70 are preferably done in-situ, for example in a Comptech ISL-3000 sputter deposition system. The deposition of the Permalloy layers are preferably done in the presence of a 25 Oersted magnetic field. Finally, the wafer is subjected to a 310 degree C., 1 hour, 1000 Oersted anneal to set the easy axis of the Permalloy layers.

Figure 9:
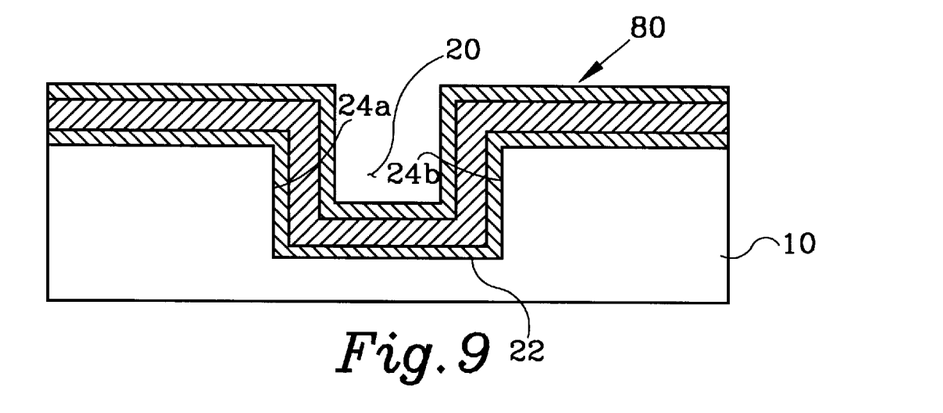
FIG. 9 is a cross section of the dielectric layer and cavity of FIG. 3 with the soft magnetic material layer deposited on the bottom and side surfaces of the cavity.
Figure 10:
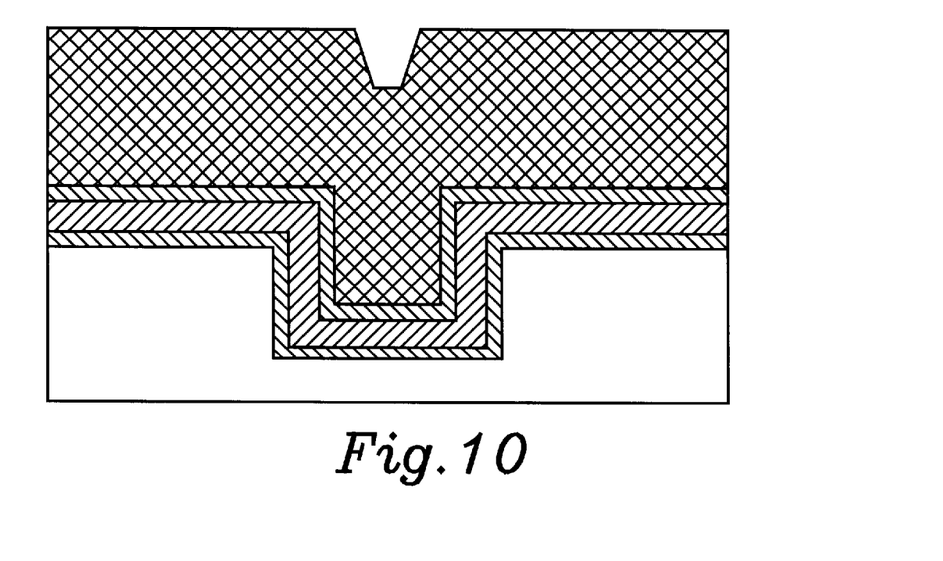
FIG. 10 is a cross section of the dielectric layer and soft magnetic material layer of FIG. 9 with the conductive material layer deposited thereon.
Figure 11:
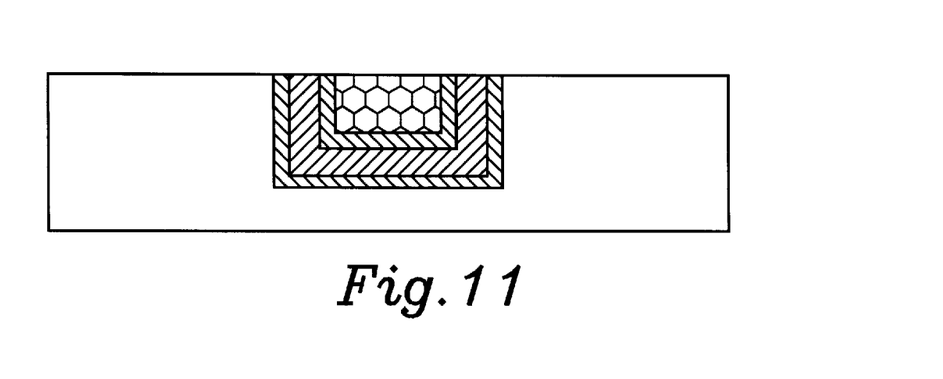
FIG. 11 is a cross section of the dielectric layer, soft magnetic material layer and conductive material layer of FIG. 10 with those portions that are above the top surface of the dielectric layer removed.
Figure 12:
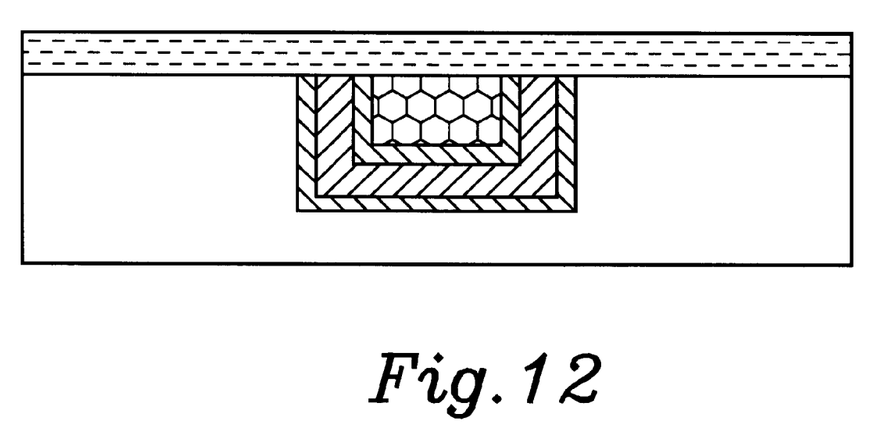
FIG. 12 is a cross section of the dielectric layer, soft magnetic material layer and conductive material layer of FIG. 11 with a thin dielectric layer deposited thereon.
Figure 13:
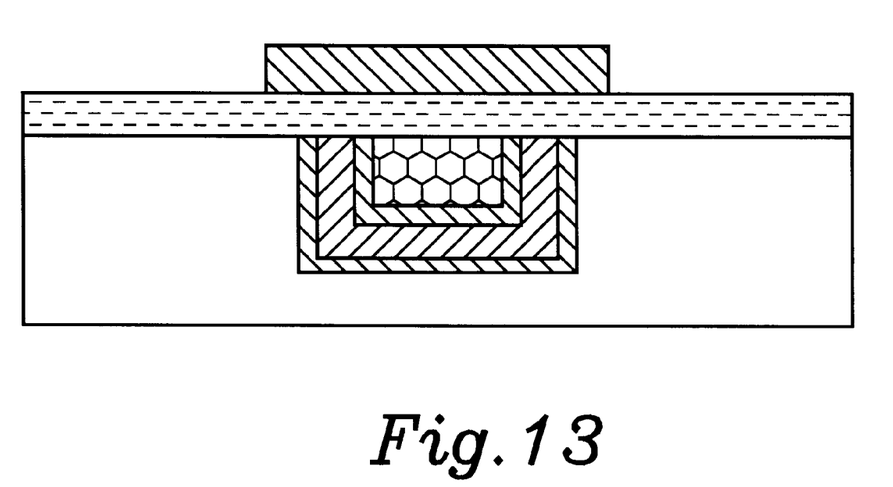
FIG. 13 is a cross section of the dielectric layer, soft magnetic material layer, conductive material layer and thin dielectric layer of FIG. 12 after the magnetic material is deposited and patterned thereon.

FIGS. 9 shows an alternative embodiment of the present invention where the soft magnetic material layer 80 is deposited on the bottom 22 and side surfaces 24a and 24b of the cavity 20. This can be accomplished by using a deposition process that covers both horizontal and vertical surfaces of dielectric layer 10, as is known in the art. The remaining fabrication steps shown in FIGS. 10–13 are similar to those described above with reference to FIGS. 5–8, respectively.

Figure 14:
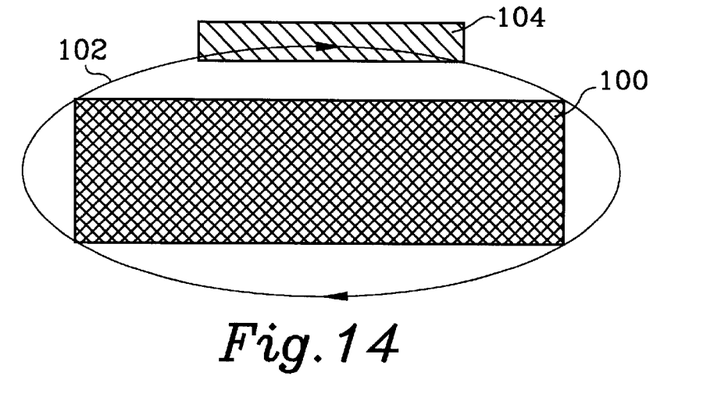
FIG. 14 is a schematic diagram showing an illustrative magnetic field produced by a word line with no magnetic field keeper.

FIG. 14 is a schematic diagram showing an illustrative magnetic field produced by a word line 100 with no magnetic field keeper. The word line 100 is carrying a current into the page to produce a magnetic field 102. The magnetic field 102 is shown extending symmetrically around word line 100 and intersecting a bit region 104.

Figure 15:
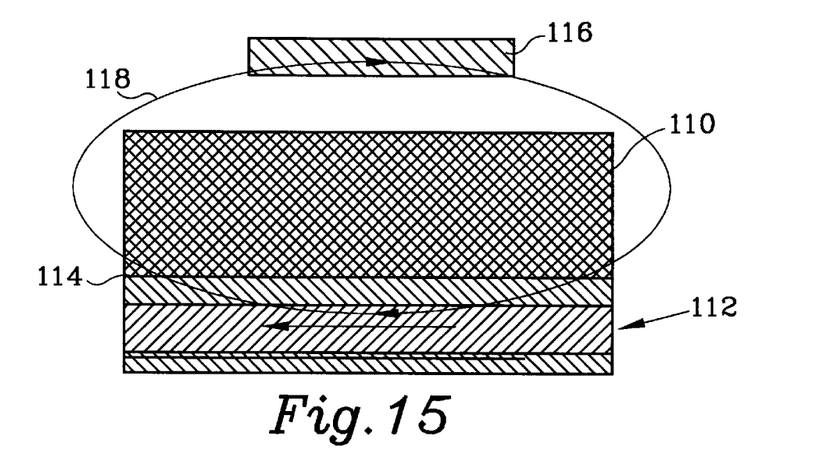
FIG. 15 is a schematic diagram showing an illustrative magnetic field produced by a word line with a magnetic field keeper on the underside of the word line.

FIG. 15 is a schematic diagram showing an illustrative magnetic field produced by a word line 110 with a magnetic field keeper 112 on the bottom surface 114 thereof. Upon application of current in the word line 110, the soft magnetic material in magnetic field keeper 112 aligns as shown, and helps concentrate the magnetic field 118 above the word line 110. This helps increase the magnetic field 118 at a bit region 116.

Figure 16:
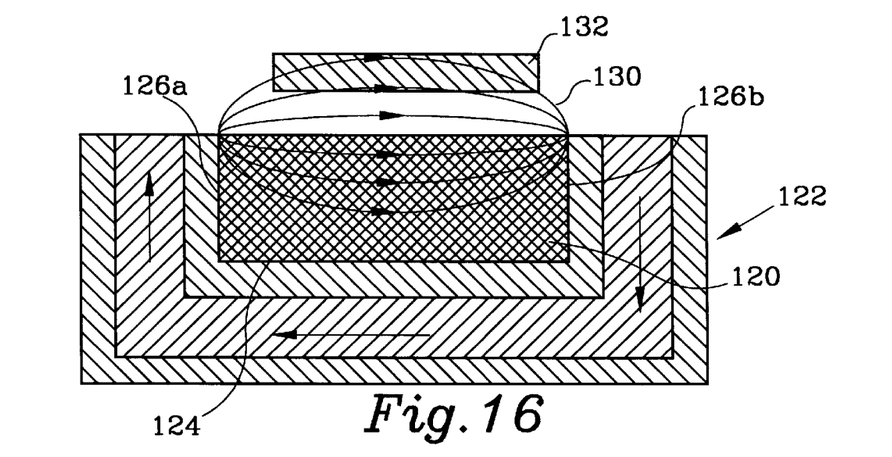
FIG. 16 is a schematic diagram showing an illustrative magnetic field produced by a word line with a magnetic field keeper on the underside and side walls of the word line.

FIG. 16 is a schematic diagram showing an illustrative magnetic field produced by a word line 120 with a magnetic field keeper 122 on the bottom surface 124 and side walls 126a and 126b thereof. Upon application of current in the word line 120, the soft magnetic material in magnetic field keeper 122 aligns as shown. By providing a magnetic keeper on the side walls 126a and 126b, the magnetic field 130 is even more effectively concentrated above the word line 120, thereby further increasing the magnetic field 130 at a bit region 132.

Figure 17:
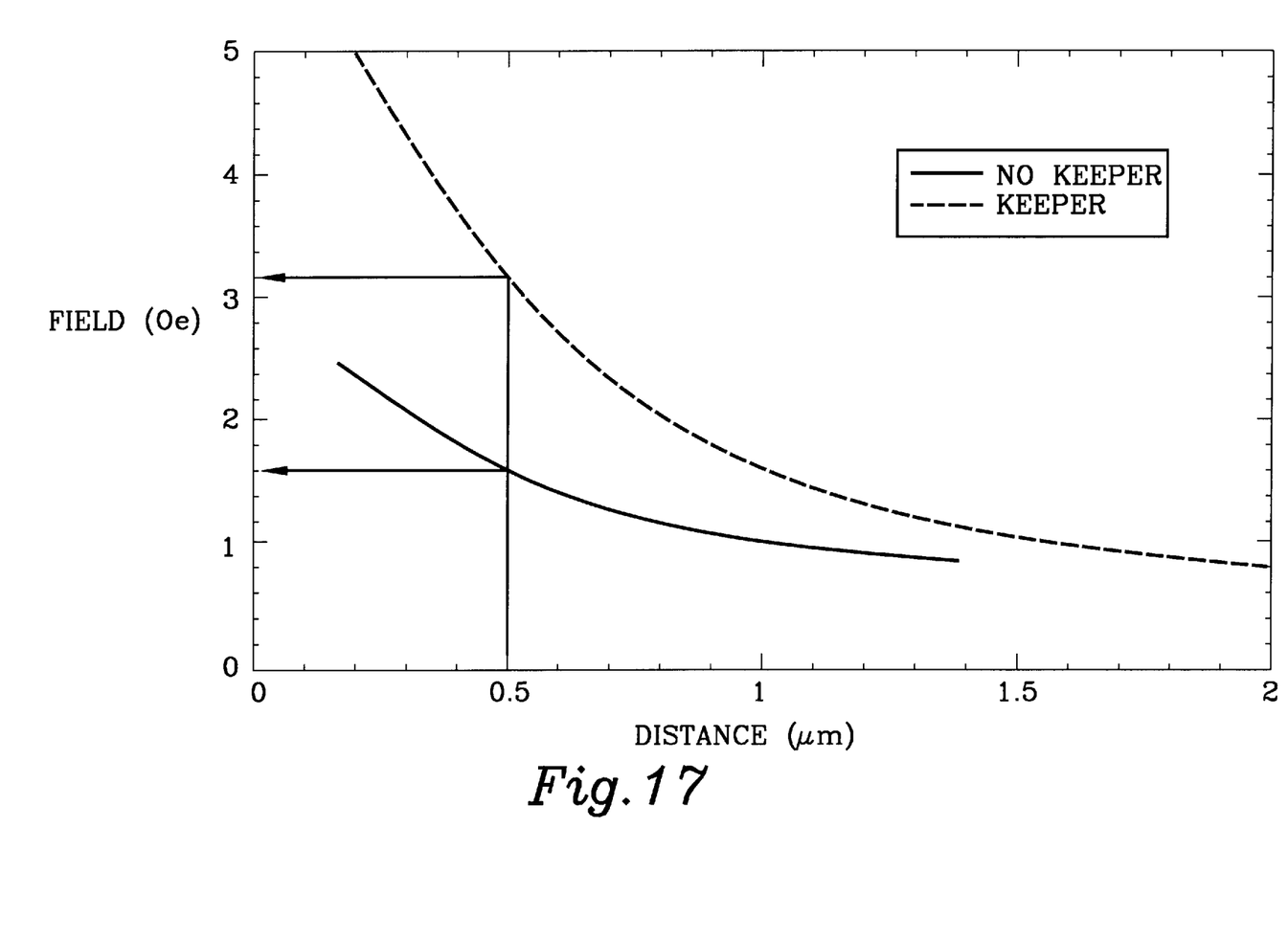
FIG. 17 is a graph showing the magnetic field provided by a word line at a corresponding bit region with and without a word line keeper.

FIG. 17 is a graph showing the magnetic field provided by a word line versus distance both with and without a word line keeper. As can readily be seen, the magnetic field at a given distance is substantially greater when a word line keeper is used. It has been found that the amount of increase in the magnetic field at a give distance, for example at the bit region, increases as the size of the word line decreases. Thus, it is believed that a word line keeper will become increasingly important as the density of magnetic memory devices increases.

It is contemplated that the magnetic field keeper of the present invention may also be used in conjunction with magnetic field sensor devices. Magnetic field sensor devices often include a magneto-resistive material in the sensor element. Generally, by measuring the resistance change of the magneto-resistive material, the magnitude of the incident magnetic field can be determined.

In most cases, the magneto-resistive material has edge domains that are magnetized in a particular direction, regardless of whether the incident magnetic field is applied. Under some circumstances, the direction of the magnetization field in one or more of the edge domains can becomes reversed. This can happen, for example, when the incident magnetic field exceeds a maximum threshold. Under these circumstances, the edge domains typically must be reset before the magnetic field sensor can resume normal operation. The edge domains are typically reset using a reset line that is placed adjacent to the magnetic field sensor. Accordingly, it is contemplated that a reset line of a magnetic field sensor device may include the above-described magnetic field keeper to increase the magnetic field produced by the reset line at the magnetic material of the sensor device.

Having thus described the preferred embodiments of the present invention, those of skill in the art will readily appreciate that the teachings found herein may be applied to yet other embodiments within the scope of the claims hereto attached.

What is claimed is;:

1. A word line structure for a monolithically formed magnetoresistive memory device having a magnetic field sensitive bit region, comprising:
    a dielectric layer having an etched cavity formed therein, wherein the cavity has a back surface and two spaced side surfaces;
    a magnetic field keeper including a soft magnetic material therein, and having a back surface and a front surface, the back surface of said magnetic field keeper being adjacent to the back surface of the cavity; and
    a conductive word line having a front surface, a back surface and two side surfaces, the back surface of the conductive word line being adjacent to the magnetic field keeper.

2. A word line structure according to claim 1 further comprising a barrier layer interposed between said magnetic field keeper and the back surface of the cavity.

3. A word line structure according to claim 1 further comprising a barrier layer interposed between said magnetic field keeper and the back surface of said conductive word line.

4. A word line structure according to claim 1 wherein the cavity is formed in a planer surface of the dielectric layer.

5. A word line structure according to claim 4 wherein the front surface of the conductive word line substantially lies in the plane formed by the planer surface of the dielectric layer.

6. A word line structure according to claim 5 further comprising a dielectric layer between the front surface of the conductive word line and the bit region.

7. A word line structure for a monolithically formed magnetoresistive memory device having a magnetic field sensitive bit region, comprising:
    a dielectric layer having an etched cavity formed therein;
    a magnetic field keeper including a soft magnetic material disposed in the cavity, and partially filling the cavity;
    a conductive word line disposed in the cavity adjacent the magnetic field keeper, substantially filling the cavity.

8. A word line structure according to claim 7 wherein a barrier layer is interposed between said magnetic field keeper and said conductive word line.

9. A word line structure according to claim 7 wherein a barrier layer is interposed between said dielectric layer and said magnetic field keeper.

10. A method for forming a word line structure for a magnetoresistive memory device having a magnetic field sensitive bit region, the method comprising the steps of:
    forming a cavity in a dielectric layer, wherein the cavity has a bottom surface and two spaced side surfaces;
    providing a soft magnetic material layer on the bottom and side surfaces of the cavity, thereby partially filling the cavity; and
    providing a conductive material layer in the cavity and on the soft magnetic material layer to at least substantially fill the cavity.

11. A method according to claim 10 wherein said soft magnetic material layer includes a first barrier layer, a second barrier layer, and a soft magnetic material disposed therebetween.

12. A method according to claim 11 wherein said forming step includes the steps of:
    applying a photoresist to a top surface of the dielectric layer;
    removing selected portions of the photoresist;
    etching the dielectric layer where the photoresist has been removed, thereby forming the cavity; and
    removing the photoresist.

13. A method according to claim 12 wherein the soft magnetic material layer is provided by:
    depositing the first barrier layer on the dielectric layer including the bottom and two spaced side surfaces of the cavity before depositing a soft magnetic material;
    depositing the soft magnetic material layer on the first barrier layer.
    depositing the second barrier layer on the soft magnetic material.

14. A method according to claim 13 wherein said first barrier layer, said soft magnetic material and said second barrier layer are deposited in one process step.

15. A method according to claim 14 wherein the conductive material layer is provided by:

depositing the conductive material layer on the soft magnetic material layer to at least substantially fill the cavity.

16. A method according to claim 15 further comprising the step of:

selectively removing the portions of the soft magnetic material layer and the conductive material layer that remain on the top surface of the dielectric layer.

17. A method according to claim 15 further comprising the step of:

selectively removing the portions of the soft magnetic material layer that remain on the top surface of the dielectric layer before the conductive material layer is provided.

18. A method according to claim 17 further comprising the step of:

selectively removing the portions of the conductive material layer that remain on the top surface of the dielectric layer.

19. A method according to claim 16 wherein the soft magnetic material layer and the conductive material layer are removed via a polishing step.

20. A method according to claim 19 wherein the polishing step is a mechanical polishing step.

21. A method according to claim 20 wherein the polishing step is a chemical-mechanical polishing step.

22. A method for forming a word line structure for a magnetoresistive memory device having a magnetic field sensitive bit region, the method comprising the steps of:

forming a cavity in a dielectric layer, wherein the cavity has a bottom surface and two spaced side surfaces;

providing a soft magnetic material layer on the bottom surface of the cavity, thereby partially filling the cavity; and providing a conductive material layer in the cavity and on the soft magnetic material layer to at least substantially fill the cavity.

23. A method for forming a magnetoresistive memory device comprising the steps of:

etching a cavity into a top surface of dielectric layer, wherein the cavity has a back surface and two spaced side surfaces;

providing a soft magnetic material layer on the back and side surfaces of the cavity, thereby partially filling the cavity;

providing a conductive material layer in the cavity on the soft magnetic material layer to at least substantially fill the cavity;

providing a dielectric layer on the top surface of the dielectric layer, and extending over the cavity; and providing a magnetic field sensitive bit region on the dielectric layer extending at least partially over the cavity.

24. A method according to claim 23 wherein the soft magnetic material layer includes a first barrier material, a second barrier material with a soft magnetic material therebetween.

25. A method according to claim 24 wherein the soft magnetic material layer is provided by:

depositing said soft magnetic material layer on the top surface of the dielectric layer including on the back and two side surfaces of the cavity.

26. A method according to claim 25 wherein said first barrier material, said soft magnetic material and said second barrier material are deposited in one process step.

27. A method according to claim 25 wherein the conductive material layer is provided by:

depositing the conductive material layer on the top surface of the dielectric layer including in the cavity on the soft magnetic material layer to at least substantially fill the cavity; and removing portions of the conductive material layer and the soft magnetic layer that are disposed above the plane formed by the top surface of the dielectric layer.

28. A method for forming a monolithic magnetoresistive memory device, the method comprising the steps of:

forming a word line, wherein the word line has a soft magnetic material on at least a portion of one surface of the word line; and forming a magnetic bit region after forming said word line, wherein said magnetic bit region is spaced from said word line and includes one or more magnetic materials therein.

* * * * *